US006628495B2

(12) United States Patent
Gerfast

(10) Patent No.: US 6,628,495 B2
(45) Date of Patent: Sep. 30, 2003

(54) FAST ACTING, RE-SETTABLE CIRCUIT BREAKER WITHOUT MOVING PARTS

(76) Inventor: Sten R. Gerfast, 1802 Valley Curve Rd., Mendota Heights, MN (US) 55118

( * ) Notice: Subject to any disclaimer, the term of this patent is extended or adjusted under 35 U.S.C. 154(b) by 45 days.

(21) Appl. No.: 09/900,643

(22) Filed: Jul. 9, 2001

(65) Prior Publication Data

US 2003/0007302 A1 Jan. 9, 2003

(51) Int. Cl.[7] ........................ H01H 73/00; G01R 19/165
(52) U.S. Cl. .................................... 361/115; 324/117 H
(58) Field of Search .......................... 361/115; 324/117, 324/127, 117 H

(56) References Cited

U.S. PATENT DOCUMENTS

| | | | | |
|---|---|---|---|---|
| 3,845,445 A | * | 10/1974 | Braun et al. | 338/32 |
| 4,218,626 A | * | 8/1980 | Fukuda et al. | 307/116 |
| 4,290,301 A | * | 9/1981 | Yamaguchi et al. | 73/35 |
| 4,761,569 A | * | 8/1988 | Higgs | 307/309 |
| 4,833,406 A | * | 5/1989 | Foster | 324/225 |
| 4,987,512 A | * | 1/1991 | Mulshine | 361/57 |
| 5,552,700 A | * | 9/1996 | Tanabe et al. | 324/117 H |
| 5,734,264 A | * | 3/1998 | Berna et al. | 324/117 H |
| 5,793,596 A | * | 8/1998 | Jordan et al. | 361/98 |
| 6,108,185 A | * | 8/2000 | Kim et al. | 361/115 |
| 6,252,389 B1 | * | 6/2001 | Baba et al. | 324/117 H |

OTHER PUBLICATIONS

EC2 Engineered Components Co. Vertical Standing Hall Effect Digital Current Sensors, Design Notes. # C/051898R, 1997.*

F. Jorgensen. The complete Handbook of Magnetic recording; TAB Professional and Reference Books, 1988, pp. 204–206.

Honeywell. Micro Switch Sensing and Control Catalog # 20, 2001.

B.D. Cullity. Introduction to magnetic materials; Addison–Wesley Publishing Co., 1972, pp. 31–35.

Richard M. Bozorth. Ferromagnetism; Van Nostrand Company, 1964, pp. 348–349.

* cited by examiner

*Primary Examiner*—Gregory J. Toatley, Jr.
*Assistant Examiner*—Z Kitov

(57) ABSTRACT

A fast acting re-settable and low cost circuit breaker without moving parts. It has a magnetic amplification feature, and can also be used as a current limiter or current sensor. The fast acting switching function is provided by a Hall device with a binary output actuated by a coil. It is operating within microseconds and can be used to protect semiconductors from destruction by overloads. Integrated circuit fabrication processes can be used for manufacturing of this invention. This device can be used on both direct current and alternating current.

18 Claims, 1 Drawing Sheet

FAST ACTING, RE-SETTABLE CIRCUIT BREAKER WITHOUT MOVING PARTS

FIELD OF THE INVENTION

This invention concerns a fast acting, re-settable and low cost circuit breaker without moving parts that also has a magnetic amplification feature. The invention can also be used as a current limiter or current sensing. The fast action switching is provided by a Hall device with binary output actuated by a coil. It is operating within microseconds, and it can therefore be used for protecting semiconductors from destruction by overloads. Integrated circuit fabrication processes can be used for manufacturing of this invention. This invention can be used both on a direct current and on alternating current.

BRIEF SUMMARY OF THE INVENTION

This invention has several advantages over previously commercially available circuit breakers. Most existing circuit breakers are of large physical size with many parts, sometimes with a multitude of movable and expensive mechanical parts. These parts wear and create reliability problems. The bulky parts also make it difficult for the designer that is designing existing circuit breakers into an electrical circuit that is to be protected. Other circuit breaker of smaller size, that are available, are not as slow as the circuit breakers mentioned above but they still have a trip time measured in milli-seconds. The present invention has no moving parts, and can be manufactured by integrated circuit processes that means that the total circuit breaker could be in a size of 1 millimeter×1 millimeter with a trip time measured in micro-seconds. In its IC chip form the present invention would also be very inexpensive compared to existing circuit breakers. The present circuit breaker can also operate on both AC and D.C.

BACKGROUND ART

Some of the simplest articles for protection of electrical overloads are fuses or so-called wax pellet fuses. These are single use protectors having the disadvantage that they require replacement after the over-current event when the fusing part melts. The incoming household current, today, is normally not protected by fuses but by large size A.C. circuit breakers that trips using a combination of over current and a magnetic relay construction. The majority of these and other large size circuit breakers also have the inconvenience that they have to be manually reset by a push button or by a handle. Both their expensive construction and size limits their use Bi-metallic devices or circuit breakers that operate by heating and bending of the bi-metal have been in use for many years for protecting many different electrical appliances and motors.

When the appliance or motor gets overheated, these thermal devices function as safety devices and thereby prevent fires in the appliance or ignition of other materials around the appliance or electrical machinery. This type of safety device is required by safety organizations such as U.L. and C.S.A.

These so-called thermal cutouts are protecting the devices very well but they are also very slow to actuate. It might take minutes for the device to heat up to the point where they turn off, thereby protecting the device. Some other devices are also on the market. Some of them are called surge absorbers or re-settable fuses that are made from a chemical composition which heats up and increases its resistance when the current gets higher than normal.

The increased resistance limits the current to the electrical circuit, appliance or motor that is normally wired in series with these thermal protectors.

These are also slow acting devices and would not protect semiconductors such as transistors, MOSFETs, S.C.R.s, or TRIACs. Normally the semiconductors mentioned are destructing within perhaps 15 to 30 microseconds.

Faster devices that are on the market have been the so-called solid state sensors, where a coil would actuate a Hall effect device. Most of these have been very large in size and they have also been quite expensive because of its large coil and the complex construction that is common in most of the solid state sensors on the market today.

The circuit breakers or over current type of solid state sensors that are based on a toroid normally have a winding surrounding the uniform cross section of the toroid. If the toroid has a cut in its circumference a Hall device is normally inserted in this cut. The uniform cross section also produces a uniform field, without flux concentration, at the Hall device. The material of the toroid could be of ferrite material, a lamination stack or a solenoid type winding but this does not alter the flux field structure. The larger amount of turns required with this type of structure to actuate the Hall device without tapered flux concentration, makes them by necessity large devices, sometimes in the cubic volume of 1 inch or more. As far as known, in this type of sensor, a tapered electromagnetic flux concentrating structure has not been used. Due to its size and expense they have been limited in their use as circuit breakers; useful only in more expensive appliances such as instruments or used as power line circuit breakers.

These devices and its coils are well understood in the background art and are described basically by: Each turn of one coil wound on such a frame generates "x" gauss of flux at one end of the frame or toroid. The coil structure of the background art as well as the coil of the present invention is, of course, governed by Faraday's law.

DISCLOSURE OF INVENTION

The invention concerns a fast acting, re-settable low cost circuit breaker without moving parts that has flux concentrating tapered legs in its ferromagnetic structure, that increases the flux available at its Hall device, thereby providing magnetic amplification. It is also a very small device that can be miniaturized for a circuit board application. It is also a very inexpensive device with only 3 simple components. In addition to being a small inexpensive device, totally without moving parts, it is also a very fast device, operating within microseconds that can protect semiconductors. It can be operated on both A.C. and D.C. These features (fast operating, re-settable, no moving parts, inexpensive device, small dimensions, and A.C. and D.C. operation) makes this a very useful new invention that can be used in many different forms described below.

Another unique advantage is that this invention can be fabricated by integrated circuit processes by depositing a coil over a deposited ferromagnetic structure. A Hall device can also be deposited in exceptionally close proximity to the ferromagnetic structure thereby efficiently using any available electromagnetic flux generated by its single coil. This makes this invention an unusually sensitive and very efficient circuit breaker or current sensor.

It could be described as a semiconductor chip re-settable circuit breaker comprising:

a current carrying coil producing a variable electromagnetic flux, a ferromagnetic structure leading said flux towards a Hall device with a binary output, said variable flux causing said output to change.

It could also be described as a monolithic circuit re-settable circuit breaker comprising:

A deposited ferromagnetic material forming a semicircular structure having a central section and two tapered legs, deposited between said legs a Hall device with a binary output, a deposited conducting material forming a coil surrounding said central section wherein when connecting current to said coil an electromagnetic flux is generated in said central section, said flux being concentrated by said legs, in turn causing said Hall output to change state.

The above mentioned integrated circuit fabrication techniques that can be used for this circuit breaker, is somewhat similar to the method used when fabricating integrated circuits, thin film, magnetic write-heads for hard discs. The difference would be, of course, that the magnetic write-head has no Hall device and no binary output and could not be used as a circuit breaker. Integration also gives the possibility of producing extremely close tolerances between the legs and the Hall device for best utilization of available electromagnetic flux. Integration could also be used to produce a micro-type circuit breaker both with close tolerances and low cost.

The present invention can also be manufactured from three separate components that are best described as a circuit breaker without moving parts on a non-magnetic frame having:

a ferromagnetic structure with a central section and two tapered flux concentrating legs, said central section having a larger volume than said two legs, disposed between said legs a Hall device with a binary output, and a coil surrounding said central section, wherein when connecting current to said coil an electromagnetic flux is generated in said central section, said flux being concentrated by said legs, in turn causing said Hall output to change state.

The invention described has a coil surrounding the central section and a tapered flux concentrating feature in its legs.

Textbooks are giving the basic theory about the magnetic flux available when the frame structure is tapered or has a diminishing area away from the coil. This concentrates the electromagnetic flux lines generated under the central section and then leading them into a smaller ferromagnetic area. This concentrates the flux and can be called magnetic amplification. Theory also states that flux lines cannot be destroyed, and that flux lines follow a ferromagnetic material rather than air, therefore the concentrated flux lines appear at the gap or legs at a higher Gauss level.

During experimentation and reduction to practice of the different forms of circuit breakers of the present invention, somewhat unexpected high electromagnetic flux levels with low coil current have been achieved.

Textbooks are stating that the electromagnetic flux field in the gap, [with a steady inducing current]:

Equals the volume (area) of structure under the coil divided by the volume (area) of the gap. Therefore if the volume of the central section under the coil in the present invention is twice as large as the volume of the two legs, then the flux level at the gap is theoretically twice as large, as if both the central section and the legs were of the same volume. Even though this formula is available in textbooks it is believed that this fact has not been applied to the construction of circuit breakers or solid state sensors in the background art.

Another advantage with the present invention is that it can go into a latched state; in other words, it would shut down the current to the electrical device, motor or machinery that it is used on, until the fault condition has been corrected. This latching function is available in commercially available Hall devices and are reset by turning off the power or reversing the current in the coil.

The invention could also be used as a continuous current monitor.

For example, used as a Wattmeter that requires both a current and a voltage input; both are provided by the present invention.

There is always an advantage with a higher output out of any device; it follows that less further electronic amplification is required.

Therefore the magnetic amplification that takes place in this invention and the larger amount of electromagnetic flux available, makes this a circuit breaker easily interfaced with other semiconductors.

If the invention is fabricated using a commercially available Hall device placed in close proximity to its legs it could drive either what is called a Hall I.C. or Hall sensor.

These are available from many manufacturers in different closeness of tolerance and pricing. They are available either as a Hall switch, Hall latch or as a linear Hall sensor. Due to the flux concentrating at the legs in this invention it requires only a few turns of its coil, on its central section, to get the necessary electromagnetic flux to change the state of the Hall device thereby providing circuit breaker action.

Commercial Hall devices are available with current capabilities of up to 1000 milli amperes which would also be the maximum current capability of the circuit breaker. By the addition of a power semiconductor such as an MOSFET, TRIAC, or S.C.R driven by this inventions binary output, the final current capability can easily be extended to hundreds of amperes.

The Hall device cannot be damaged by being driven by large flux levels since it does not have an upper magnetic limit.

The circuit breaker of this invention can be used to protect a motor such as a brushless motor that normally is driven by a multitude of MOSFETs. The coil of the invention would normally be connected in series with the power supply to the motor. Normal current to the motor, determined by the number of turns in the coil and the sensitivity of the Hall device, would allow the motor to run normally. If a fault condition should occur, the current through the coil would increase, tripping the Hall device to its closed position thereby pulling all of the gates of the MOSFETs to ground, instantaneously providing a circuit breaker function; removing all current to the motor. This type of application is depicted in FIG. 6.

THE DRAWING

In the drawing, FIG. 1 is a perspective of an integrated-circuit-type of a circuit breaker showing an integrated deposited ferromagnetic structure, an integrated deposited coil and an integrated deposited Hall device of the invention. The integrated components could be on a non magnetic frame {not shown}

Figure 1:
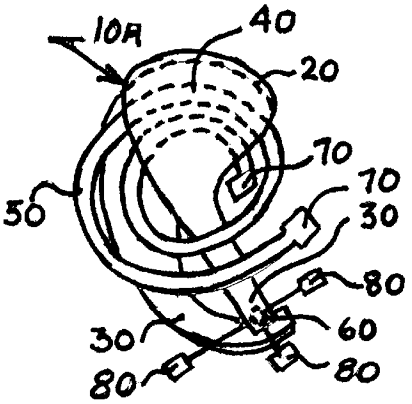

The integrated-circuit-type assembly of a circuit breaker (10 A) of the present invention shown in FIG. 1 has a deposited coil (50) that has been deposited on the ferromagnetic structure (20). A second deposited ferromagnetic layer on top of the coil completes the ferromagnetic structures central section (40) as well as its leg (30). Also shown is an integrated deposited Hall device (60) placed between the legs (30) of the ferromagnetic structure.

Figure 2:
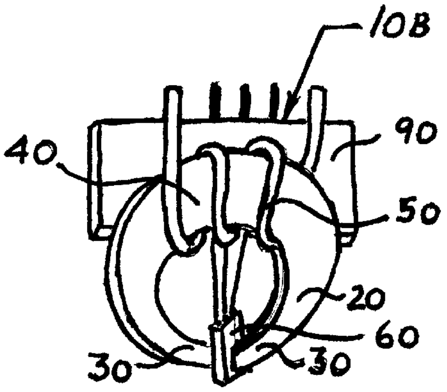
FIG. 2 is another embodiment of the same invention that also contains a semi-circular ferromagnetic structure with two tapered flux concentrating legs with a coil mounted on the structures central section with a Hall device mounted between these legs. These components are shown on a non magnetic frame with output pins for connection to a circuit board.

Connection bonding pads (70) for the coil and connection bonding pads (80) for the Hall device are also shown. The assembly could be over molded with plastic (not shown) FIG. 2 The circuit breaker (10 B) of the invention has a ferromagnetic structure (20), with the the ferromagnetic material preferably made out of soft iron such as cold rolled steel or other ferromagnetic material. In making the ferromagnetic structure from a flat sheet of iron it can be punched out both with a larger diameter and also with a smaller diameter, that is offset, to give a central section and two legs tapering down to a smaller section. The ferromagnetic structure is wound with a coil (50) with a few turns. The coil is preferably made out of magnet wire which is wound on the central section (40); mounted between the two legs (30) is a Hall device (60). This device is in close proximity to the legs (30). The coil (50) has two end connections that normally are connected in series with the appliance that it is protecting from overloads.

Both the ferromagnetic structure with the coil and the Hall device are all mounted on a non-magnetic frame (90) which is preferably made out of non-conducting as well as a non-magnetic material such as plastic. The coil wires could protrude from that plastic material and could be inserted into a circuit board together with the three wires coming from the magnetic sensor (60).

The spacing of the two lead wires and the three wires coming from the magnetic sensor is preferably spaced to accept the standard dimensions and pin spacing used by semiconductor manufacturers. The total assembly could be inserted in a circuit board that could either be a "tru-hole" or "surface-mount" circuit board. If it is desired, the whole assembly as pictured in FIG. 2 could be either dipped in an electronic type compound or over molded with plastic. (not shown) This is sometimes normal procedures used for semiconductors or capacitors.

Figure 3:
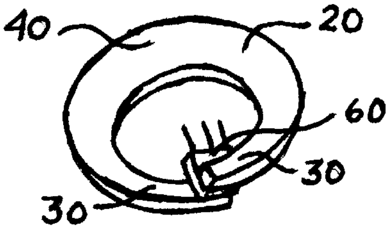
FIG. 3 is a similar embodiment shown in FIG. 2 of this invention with the flux concentrating legs crossed across the sensor which is either a Hall device or a magnetic reed switch.

FIG. 3 basically has the same type of ferromagnetic structure (20) but it is in a different configuration, again made out of soft iron. It has the same two legs (30) but a different kind of a design. In between the two crossed legs is a magnetic sensor (60), (that could be either a Hall device or a magnetic reed switch that both have binary outputs) again in a close proximity to the legs very similar to FIG. 2.

Figure 4:
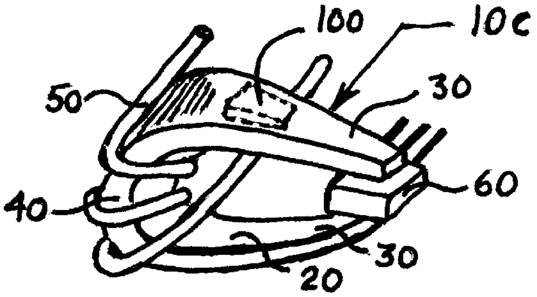
FIG. 4 is yet another embodiment of the same invention showing a differently shaped ferromagnetic structure, a coil and a Hall device. Also shown is a bias permanent magnet on a leg.

FIG. 4 Shown is circuit breaker (10 C) with a ferromagnetic semicircular structure (40) of the present invention that is shaped more like a horseshoe. It also has two legs (30), a coil (50) around its central section (40) and a Hall device (60) mounted in close proximity to the legs. Also shown is a permanent magnet (100) that could be used as a bias magnet to alter the binary outputs trip point.

Figure 5:
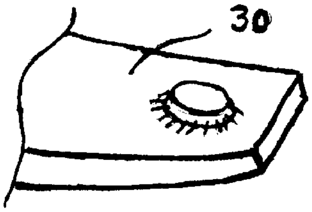
FIG. 5 Is a protrusion on a leg to further localize the magnetic flux at the sensitive part of the Hall device.

FIG. 5 shows a small protrusion on the surface of the leg (30) that could be used to further enhance the magnetic flux induction into the sensitive area of the Hall device (60).

Figure 6:
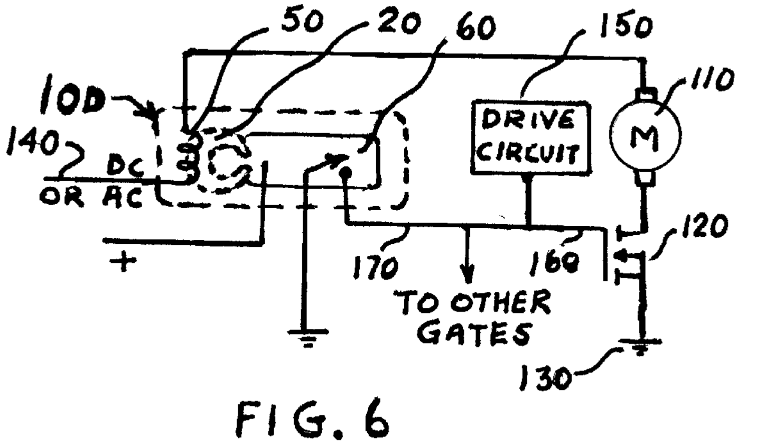
FIG. 6 Is a schematic drawing of a circuit breaker of the invention used as an over current protector in a motor circuit.

FIG. 6 is a simplified diagram of the invention used as an over-current circuit breaker (10 D). It shows the basic circuit breaker with its binary output in its open position; which is in this circuit its "normal" operation.

The ferromagnetic structure (20) the coil (50) and the Hall device (60) are also shown. The coil (50) is connected to a motor (110) which in turn is connected to a transistor called a MOSFET (120) which is connected to ground (130).

The power to the motor and to the MOSFET (120) is supplied by incoming wire (140). There is also a general driving circuit (150) for the motor, connected to the gate (160). The binary output of the present invention's Hall device (170) is also connected to the gate (160). Under normal conditions, the current flows from the incoming wire (140) through the coil (50) into the motor (110) through the MOSFET (120) into ground (130) driving the motor at normal current.

Under normal conditions the magnetic flux at the Hall device (60) is inadequate to trip the binary output of the Hall device and normal operation of the motor is achieved. If there is a fault condition in the motor, it will then draw more current which also increases the current in coil (50) which also increases the magnetic flux at both legs. That flux is amplified by the tapered section of the ferromagnetic structure to produce a magnetic flux which is now adequate to trip or switch the magnetic sensor to the ON condition. That switching function will then be at the output of the Hall device (170) and this in effect pulls the gate (160) instantly to ground (130), thereby shutting off the MOSFET.

If there are other gates of other MOSFETs that are also driving the motor (110) these gates will also at the same instant be pulled to ground. This means that a single circuit breaker of the invention can be used to turn off many power MOSFET's. After the fault condition has occurred no current will be fed to the motor.

The circuit breaker of this invention can be reset by turning off the main power or by reversing the current in the coil (50).

Because of the very rapid switching function of its binary output Hall device in this invention, it can be used both on direct current and alternating current. A.C. current normally used in the United States is 60 Hertz where the alternating current pulses are 16 milli seconds apart. In other parts of the world 50 Herz A.C. is used (20 milli seconds apart). The binary output switches in micro seconds making this circuit breaker turn off the power before even one current pulse of A.C. has occurred.

The illustrations of the present invention that are shown are by no means conclusive of how the invention can be used. A person skilled in the art could easily make many different configuration and uses for this invention. With the present trend of miniaturization this invention ranging from mini to micro is therefore very timely.

What is claimed is:

1. A semi-conductor chip re-settable circuit breaker comprising:

a current carrying coil producing a variable electromagnetic flux, a ferromagnetic structure leading said flux towards a Hall device with a binary output, said variable flux causing said output to change;

all contained in said chip.

2. A monolithic circuit re-settable circuit breaker comprising:

a deposited ferromagnetic material forming a semicircular structure having a central section and two tapered legs, deposited between said legs a Hall device with a binary output, a deposited conducting material forming a coil surrounding said central section, wherein when connecting current to said coil an electromagnetic flux is generated in said central section, said flux being concentrated by said legs, in turn causing said Hall output to change state;

all contained in said circuit.

3. A re-settable circuit breaker without moving parts comprising:

on a non-magnetic frame, a semicircular ferromagnetic structure having a central section and two tapered flux concentrating legs, said central section having a larger volume than said two legs, disposed between said legs a Hall device with a binary output, and a coil surrounding said central section, wherein when connecting current to said coil an electromagnetic flux is generated in said structure, said flux being further concentrated by said legs, in turn causing said Hall output to change state.

4. A circuit breaker as defined in claim 2 wherein the output of said Hall devise varies linearly with flux level.

5. A circuit breaker as defined in claim 4 wherein said linear output can be used either as a current monitor, current limiter or as a circuit breaker.

6. A circuit breaker as defined in claim 3 wherein the output of said Hall device is a latching function.

7. A circuit breaker as defined in claim 2 wherein said two tapered flux concentrating legs provide magnetic amplification.

8. A circuit breaker as defined in claim 3 wherein said binary output is re-settable by disconnecting current.

9. A circuit breaker as defined in claim 1 wherein said binary output rapidly changes state in micro-seconds.

10. A circuit breaker as defined in claim 9 wherein said rapid change allows said binary output to change before one half cycle of regular household A.C. current at 60 or 50 Hz. has occurred.

11. A circuit breaker as defined in claim 3 wherein said concentrated electromagnetic flux in said legs is causing a binary output of a reed switch to change.

12. A circuit breaker as defined in claim 1 wherein said binary output is driving a power semi-conductor.

13. A circuit breaker as defined in claim 12 wherein said binary output can be in milli amperes and said power-conductors output can be measured in hundreds of amperes.

14. A circuit breaker as defined in claim 3 wherein said binary output and said coil are terminated by output pins conforming to standardized dimensions and standardized pin spacings used by semi-conductor industry, such as JAN MIL-M-38510.

15. A circuit breaker as defined in claim 3 wherein said legs have an extending protrusion further concentrating electromagnetic flux in said legs into said Hall device.

16. A circuit breaker as defined in claim 2 wherein said binary output is electrically isolated from said coil.

17. A circuit breaker as defined in claim 3 wherein said legs is having an attached permanent bias magnet to alter said binary output.

18. A circuit breaker as defined in claim 2 wherein said frame, said structure, said Hall device and said coli are over-molded or encapsulated by a non-conducting material.

* * * * *